(12) United States Patent
Hertel et al.

(10) Patent No.: US 9,634,236 B2
(45) Date of Patent: Apr. 25, 2017

(54) MAGNETOELECTRONIC COMPONENTS AND MEASUREMENT METHOD

(75) Inventors: Riccardo Hertel, Aachen (DE); Ming Yan, Juelich (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 618 days.

(21) Appl. No.: 13/138,986

(22) PCT Filed: May 3, 2010

(86) PCT No.: PCT/DE2010/000495
§ 371 (c)(1),
(2), (4) Date: Jan. 6, 2012

(87) PCT Pub. No.: WO2010/130240
PCT Pub. Date: Nov. 18, 2010

(65) Prior Publication Data
US 2012/0098534 A1 Apr. 26, 2012

(30) Foreign Application Priority Data

May 14, 2009 (DE) .................. 10 2009 021 400

(51) Int. Cl.
*G01R 33/02* (2006.01)
*H01L 43/00* (2006.01)
(Continued)

(52) U.S. Cl.
CPC .......... *H01L 43/00* (2013.01); *G01R 33/1292* (2013.01); *G11C 19/0808* (2013.01);
(Continued)

(58) Field of Classification Search
CPC . H01L 21/00; H01L 2221/00; G11C 2207/00; G11C 5/00
(Continued)

(56) References Cited

U.S. PATENT DOCUMENTS 3,256,483 A * 6/1966 Broadbent .................... 324/693
5,032,945 A * 7/1991 Argyle et al. ............ 360/125.41
(Continued)

FOREIGN PATENT DOCUMENTS

CN 1819023 8/2006
JP 2008-034808 2/2008
(Continued)

OTHER PUBLICATIONS

[Proceedings of the Fourth International Workshop on Particle Physics and the Early Universe : Jeju Island, Korea, Sep. 4-8, 2000; Jihn E. Kim, Pyungwon Ko, Kimyeong Lee; World Scientific, Jan. 1, 2001], hereinafter Kim.*

(Continued)

*Primary Examiner* — Jermele M Hollington
*Assistant Examiner* — Temilade Rhodes-Vivour
(74) *Attorney, Agent, or Firm* — Norris McLaughlin & Marcus, P.A.

(57) ABSTRACT

Magnetoelectronic components comprise at least one oblong working structure made of a ferromagnetic material, along which magnetic domain walls can migrate, means for applying an electric current to this working structure, and at least one magnetic field sensor for the magnetic field generated by the working structure. The working structure is designed so that it is able to form domain walls, the transverse magnetization direction of which in the center has no preferred direction in the plane perpendicular to the migration direction thereof along the working structure, and/or can form massless domain walls. It was found that the kinetic energy of such moving domain walls vanishes. These walls are thus not subject to the Walker limit nor to intrinsic pinning. As a result, the components can read, store or process and finally output information more quickly. The invention also relates to a method for measuring the non-adiabatic spin transfer (Continued)

parameter β of a ferromagnetic material. This method was developed as part of a more in-depth examination of the phenomena that were found.

8 Claims, 6 Drawing Sheets

(51) Int. Cl.
    *G01R 33/12* (2006.01)
    *G11C 19/08* (2006.01)
    *H01L 21/00* (2006.01)

(52) U.S. Cl.
    CPC ...... *G11C 19/0841* (2013.01); *G11C 2207/00* (2013.01); *H01L 21/00* (2013.01); *H01L 2221/00* (2013.01)

(58) Field of Classification Search
    USPC .... 324/252, 207.14, 207.16, 207.17, 207.21, 324/207.22, 211, 212, 213, 214, 215, 260, 324/263, 76.61
    See application file for complete search history.

(56) References Cited

U.S. PATENT DOCUMENTS

| | | | |
|---|---|---|---|
| 5,373,408 A * | 12/1994 | Bischoff et al. | 360/125.53 |
| 5,436,781 A * | 7/1995 | Matono et al. | 360/125.63 |
| 5,695,864 A * | 12/1997 | Slonczewski | 428/212 |
| 6,384,600 B1 * | 5/2002 | Coehoorn | B82Y 10/00 324/252 |
| 6,566,872 B1 * | 5/2003 | Sugitani | 324/249 |
| 6,617,055 B2 * | 9/2003 | Gill | 428/811.2 |
| 7,236,386 B2 * | 6/2007 | Parkin | G11C 11/14 365/158 |
| 7,307,418 B2 * | 12/2007 | Low et al. | 324/210 |
| 2002/0158626 A1 * | 10/2002 | Shay | G01N 27/902 324/207.16 |
| 2003/0197505 A1 * | 10/2003 | Sakakima | B82Y 10/00 324/252 |
| 2004/0056652 A1 * | 3/2004 | Bomya | B60R 21/0136 324/207.17 |
| 2005/0122636 A1 * | 6/2005 | Carey et al. | 360/324.11 |
| 2006/0120132 A1 | 6/2006 | Parkin | |
| 2006/0124756 A1 * | 6/2006 | Brown | 235/492 |
| 2007/0252588 A1 * | 11/2007 | Nishiyama | B82Y 10/00 324/207.21 |
| 2008/0025060 A1 | 1/2008 | Lim et al. | |
| 2009/0309581 A1 * | 12/2009 | Fermon | G01R 33/09 324/207.21 |
| 2010/0007344 A1 * | 1/2010 | Guo | G01R 33/098 324/260 |

FOREIGN PATENT DOCUMENTS

| | | |
|---|---|---|
| JP | 2009-503883 | 1/2009 |
| WO | WO-2007/015055 | 2/2007 |

OTHER PUBLICATIONS

Parkin S S P et al: "Magnetic domain-wall racetrack memory" Science, American Association for the Advancement of Science, Washington, DC; US, vol. 320, No. 5873, Apr. 11, 2008 (Apr. 11, 2008), pp. 190-194, XP009137973 ISSN: 0036-8075 p. 191, right-hand column, paragraph 2—p. 193, right-hand column, pagraph 1.
R Colin Johnson: "IBM uses 'racetrack' to advance memory storage" EETimes, [online] Apr. 11, 2007 (Apr. 11, 2007), XP002598314 Retrieved from the Internet: URL: http://www.eetimes.com/electronics-news/4070914/IBM-uses-racetrack-to-advance-memory-sorage> [retrieved on Aug. 25, 2010] the whole document.
Neumaier D et al: "Quantum transport in ferromagnetic permalloy nanostructures" Physical Review B (Condensed Matter and Materials Physics) American Physical Society by AIP USA, vol. 78, No. 17, 174424, Nov. 1, 2008 (Nov. 1, 2008), pp. 1-6, XP002598315 ISSN: 1098-0121 p. 1, right-hand column, paragraph 2 p. 4, right-hand oclumn, paragraph 1.
S. Lepadatu et al: Experimental determination of psin-transfer torque nonadiabaticity parameter and spin polarization in permalloy. In: Phys. Rev. B 79, 2009. S. 094402-1-094402-6.
D. A. Allwood, G. Xiong, C. C. Fualkner, D. Atkinson, D. Petit, R. P. Cowburn, "Magnetic Domain Wall Logic", Science 309, 1688 (2005) pp. 1-6.
R. Hertel, W. Wulfhekel, J. Kirschner, "Domain-wall induced phase shift in Spin Waves", Physcial review Letters 93, 257202-1-257202-4 pgs (2004).
N. L. Schryer, L. R. Walker, "The motion of 180 degress domain walls in uniform dc magnetic fileds", Journal of Applied Physics 45, 5406-5421 pgs (1974).
M. Klaeui, P.-O. Jubert, R. Allenspach, A. Bischof, J.A.C. Bland, G. Faini, U. Ruediger, A.A.F. Vax, L. Vila, C. Vouille, "Direct observation of domain-wall configurations transformed by spin currents", Physcial Review Letters 95, 026601-1-026601-4 pgs (2005).
W. Doering, Zeitschrift fuer naturfoschung [Magazine for Natural Research] 3a, 373-379 pgs (1948).
A. Mougin, M. Cormier, J. P. Adam, P. J. Metaxas, J. Ferre, "Domain wall mobility, stability and walker breakdown in magnetic nanowires", Europhysics Letters 78, 57007-p. 1-57007-p. 6 (2007).

* cited by examiner

MAGNETOELECTRONIC COMPONENTS AND MEASUREMENT METHOD

BACKGROUND OF THE INVENTION

The invention relates to magnetoelectronic components and to a measurement method, in the execution of which these components can be employed.

Magnetic shift registers, which are also known as "race track memory", are magnetic memory devices that combine the robustness of flash memory, the speed of DRAM memory as well as the reversibility and non-volatility of hard drives. Such a shift register is known from (S. S. P. Parkin, M. Hayashi, L. Thomas, "Magnetic Domain Wall Racetrack Memory", Science 320, 190 (2008)). Changes in magnetization, and thus domain walls, are introduced in oblong, ferromagnetic memory structures and pass through the memory structures longitudinally. This process takes advantage of an effect known as the spin transfer effect, as a result of which magnetic domain walls can be moved in thin memory structures in a controlled manner, along these memory structures, by applying electric currents. As is customary for hard drives, digital data is encoded into the distance between two consecutive domain walls.

Mobile domain walls play a role not only in storing, but also in processing information. Logic elements that process movable domain walls as information units are known from (D. A. Allwood, G. Xiong, C. C. Faulkner, D. Atkinson, D. Petit, R. P. Cowburn, "Magnetic Domain Wall Logic", Science 309, 1688 (2005)). Domain walls were proposed in (R. Hertel, W. Wulfhekel, J. Kirschner, "Domain-wall induced phase shift in Spin Waves", Physical Review Letters 93, 257202 (2004)) as information units in logic elements based on the propagation of spin waves along thin magnetic strips.

A basic prerequisite for the aforementioned elements to function is the fast and controlled motion of domain walls along thin magnetic strips. The disadvantage, however, is the velocity at which the domain walls can move in the memory structures, or in the logic elements, is restricted to several 100 m/s. as a result of the Walker limit (N. L. Schryer, L. R. Walker, "The motion of 180° domain walls in uniform dc magnetic fields", Journal of Applied Physics 45, 5406 (1974)). Above the maximum velocity defined by the Walker limit, cyclic, structural changes in the magnetization take place in the domain walls, putting the integrity of the stored or processed information at risk and drastically reducing the storage or processing rate (M. Kläui, P.-O. Jubert, R. Allenspach, A. Bischof, J. A. C. Bland, G. Faini, U. Rudiger, C. A. F. Vaz, L. Vila, C. Vouille, "Direct observation of domain-wall configurations transformed by spin currents", Physical Review Letters 95, 026601 (2005)).

SUMMARY OF THE INVENTION

It is therefore the object of the invention to provide a magnetoelectronic component which can read, store or process and finally output information more quickly than has heretofore been possible according to the prior art. Another object of the invention is to simplify the determination of the non-adiabatic spin transfer parameter $\beta$, which is technologically essential for such working structures, as compared to the prior art.

These objects are achieved according to the invention by magnetoelectronic components according to the main claim and additional independent claim, and by a method according to a further independent claim, in which these components can be employed. Advantageous embodiments will be apparent from the dependent claims.

As part of the invention, a magnetoelectronic component was developed. This component comprises at least one oblong working structure made of a ferromagnetic material, along which magnetic domain walls can migrate, means for applying an electric current to this working structure, and at least one magnetic field sensor for the magnetic field generated by the working structure.

An oblong structure shall be understood in particular as a structure having a ratio of diameter to length of less than 1:5, preferably less than 1:10, and still more preferably of less than 1:20. Examples of oblong structures are wires, and notably nanowires.

According to the invention, the working structure is designed so as to be able to form domain walls, the transverse magnetization direction of which in the center has no preferred direction in the plane perpendicular to the migration direction thereof along the working structure.

It was found that the very existence of such a preferred direction constitutes a physical cause of the migration velocity of domain walls along the working structure being subject to the Walker limit. If a preferred direction exists, each transverse magnetization direction of a domain wall is associated with potential energy with respect to this preferred direction. The further the actual transverse magnetization direction is away from the preferred direction, the more this energy increases.

It was further found that, in the case of a moving domain wall, the energy that is present in the deviation of the transverse magnetization direction of the wall from an existing preferred direction is dependent on the velocity of the motion. The magnetization direction aligns at an equilibrium along the preferred direction to as to minimize the potential energy.

If the domain wall is moved along the working structure by external influence, this energy equilibrium is disturbed. Torque acts on the magnetization, causing misalignment of the domain wall with respect to the preferred direction. As a result, potential energy is constantly present with respect to this preferred direction. Some of this potential energy, which can be attributed to the motion, is converted into exchange energy, which is to say the inhomogeneity of the magnetization in the working structure increases when the domain walls are moved faster through the working structure. The rise in potential energy and exchange energy resulting from the dynamics of the domain wall can formally be interpreted as kinetic energy.

If the kinetic energy exceeds a critical threshold, the magnetization in the working structure is altered so much that the micromagnetic structure of the domain walls breaks down and the accumulated energy is released by spin waves. In the process, magnetic vortices are generated and/or destroyed. In any case, this is associated with a significant change in the structure of the domain wall as compared to the equilibrium case.

By designing the working structure such that no preferred direction exists, this kinetic energy associated with the motion of the domain walls is eliminated. It is thus no longer a limiting factor for the velocity of migration along the working structure. For applications in the magnetoelectronic component, this means that the component can record, process or store and finally output information considerably more quickly than the magnetoelectronic components known from the prior art.

The type of domain wall that forms between mutually adjoining regions of the working structure having differing magnetizations is defined by the shape, the inner structure, and the material of the working structure. The anisotropies and magnetic potential landscapes defined by these parameters define the state of minimal energy at the boundary between the differently magnetized regions. As a result, the type and structure of the domain wall that forms at this boundary are defined.

In order to provide a deeper physical understanding of the effects that were found, the inventors hereafter draw on formalism introduced in 1948 by Daring (W. Döring, Zeitschrift für Naturforschung [Magazine for Natural Research] 3a, 373 (1948)), which assigns kinetic energy and a mass to domain walls based on the fact that moving domain walls change as compared to non-moving walls and the increase in energy thereof is proportional to the square of the velocity. The term of a domain wall with mass is generalized to the effect that a mass is associated with a moving domain wall every time the energy rises as compared to a non-moving domain wall, and does so not only when the energy rises with the square of the velocity.

Within the scope of this formalism, the magnetoelectronic component developed by the inventors comprises at least one oblong working structure made of a ferromagnetic material, along which magnetic domain walls can migrate, means for applying an electric current to this working structure, and at least one magnetic field sensor for the magnetic field generated by the working structure.

According to the invention, the working structure is now designed so as to be able to form massless domain walls.

It was found that the limitation of the velocity of domain walls in the working structure to typically a few 100 m/s, known as the Walker limit, is due to the mass of the domain walls. The inventors consider the known fact that domain walls which are moved along thin magnetic strips exhibit momentum and inertia, and thus particle-like dynamics, to be proof that the mass of domain walls is no mathematical abstraction, but the cause of measurable effects. They found that the mass of domain walls is also the cause of the existence of the Walker limit for the migration velocity of domain walls. The physical relationship between the Walker limit and the mass of domain walls lies in the dynamic alteration of the domain wall structures during the motions thereof and the resulting increase in the energy density thereof. The energy density increases until the micromagnetic structure breaks down. The Walker limit is thus tied to the presence of kinetic energy. A moving domain wall with mass will inevitably have kinetic energy and thus be subject to the Walker limit.

It was accordingly found that the kinetic energy of moving massless domain walls vanishes. Massless domain walls thus exhibit dynamic behavior, which can be utilized particularly advantageously for a magnetoelectronic component. Massless domain walls are not subject to the Walker limit and, as a result, can propagate considerably more quickly than domain walls with mass. Because intrinsic pinning of domain walls is also caused by the mass thereof, massless domain walls are also not subject to this pinning and the additional limitations in terms of dynamics associated therewith. Massless domain walls pass through the working structure at a velocity that is dependent in a substantially linear manner on the current density in the working structure. For applications in the magnetoelectronic component, this means that the component can record, process or store and finally output information considerably more quickly than the magnetoelectronic components known from the prior art.

For massless domain walls, the critical current that is required to initiate the motion of the walls through the working structure also vanishes. According to the prior art, high values of this critical current were another obstacle in terms of the application maturity of magnetoelectronic components of the type in question. Previously, the technical difficulty was that currents were able to flow through thin working structures only up to a defined current intensity without destroying these structures. Because, at a minimum, a critical current intensity was required to be able to move the domain walls at all, the technologically usable range of current intensities was overall severely limited. The working structures were heated unnecessarily, and scarce power, notably in battery-operated mobile applications, was wasted.

As is explained in the specific description section, the inventors demonstrated, through analytical computations and micromagnetic finite element simulations, that massless domain walls exist in a working structure that has a cylindrical design at least in some sections. This is the first proof ever that massless domain walls exist in a specific structure. Based on previously available information in the expert community, massless domain walls were merely an ideal notion within the scope of the aforementioned concept of domain walls with mass. The proof provided by the inventors thus goes far beyond merely providing a concrete example of a working structure that is able to form massless domain walls. It rather encompasses the general technical teaching that massless domain walls can actually be used in practice for magnetoelectronics.

A person skilled in the art is generally faced with the problem of producing a working structure while observing specifically defined boundary conditions. These boundary conditions notably follow from the specific purpose of the component and the specifications for the location of a complex circuit at which the component is to be employed. Provided with the above general technical teaching, this person can also apply the means that were used by the inventors for the proof obtained based on the specific example, and that were provided in the specific description section, to systems that satisfy the boundary conditions set out. From the category of all systems that satisfy the boundary conditions, this person will then be able to locate those that are able to form massless domain walls, or that are able to form domain walls, the transverse magnetization direction of which in the center has no preferred direction in the plane perpendicular to the migration direction thereof along the working structure. Refining a working structure that is characterized by defined specifications by these additional advantageous properties has become an additional design step that is available to the person skilled in the art as a result of the disclosure provided by the inventors.

The teaching of the independent device claims can thus be carried out by a person skilled in the art.

Massless domain walls, or domain walls the transverse magnetization direction of which in the center has no preferred direction in the plane perpendicular to the migration direction thereof along the working structure, can notably be frontal domain walls. These are domain walls in which the magnetization along the migration direction through the working structure is rotated by 180°, wherein the walls separate two regions of the working structure which are magnetized opposite of each other. These regions can be magnetized through the working structure, notably along or counter to the migration direction of the domain walls.

Massless domain walls, or domain walls the transverse magnetization direction of which in the center has no preferred direction in the plane perpendicular to the migration direction thereof along the working structure, can notably be transverse domain walls. The magnetization of the working structure along each cross-section perpendicular to the migration of the domain walls is then substantially homogeneous. The micromagnetic structure is then dependent solely on the position along the working structure, and not on the distance from the center of the domain wall.

The electric current that can be introduced in the working structure by the appropriate means is the driving force for the migration of domain walls along the working structure. Suitable current pulses can generate changes in magnetization, and thus in the domain walls proper, in the material of the working structure. As an alternative, the changes in magnetization can, however, also be introduced in the working structure by way of a local magnetic field and/or by a rotating magnetic field. Moreover, a rotating magnetic field may be employed, instead of an electric current, so as to additionally advance the domain walls along the working structure. However, this advancement is considerably lower than the advancement that can be achieved by the electric current.

In an advantageous embodiment of the invention, means for applying a magnetic field, in particular a rotating and/or local magnetic field, to the working structure are provided.

In a particularly advantageous embodiment of the invention, the working structure has no effective anisotropy perpendicular to the migration direction of the domain walls along the working structure. Such a working structure can be implemented, for example, in the form of a structure in which the symmetry is such that the shape anisotropy component vanishes perpendicular to the migration direction of the domain walls. The domain walls can pass through this working structure, notably along the axis of symmetry thereof.

The structure is then advantageously made of a ferromagnetic material, which itself has no crystalline anisotropy. Such a material can be amorphous, for example, and can comprise a large number of small and randomly oriented crystallites, so that the crystalline anisotropy, on average, no longer has an effect. One example of such a material is Permalloy.

As an alternative, however, the working structure may also have shape anisotropy perpendicular to the migration direction of the domain walls. This can be compensated for by opposite and equal, such as crystalline, anisotropy of the ferromagnetic material, for example. Wires having an elliptical but not circular cross-section can thus be designed, for example, so that the effective anisotropy perpendicular to the migration direction of the domain walls totally vanishes. In this example, the shape anisotropy can be compensated for by material anisotropy along one of the principal axes.

The particular dynamic properties of the domain walls, and notably the elimination of the Walker limit for the migration velocity thereof along the working structure, take effect when the transverse magnetization component in the center of the domain wall does not have a preferred direction in the plane perpendicular to the migration direction due to the (effective) symmetry around the migration direction. So as to achieve the aforementioned advantages in terms of faster input, processing and/or storage, and finally output, of information, it is not necessary for the domain walls to be exactly massless, for effective anisotropy to exactly vanish, or for the domain walls to be perfect one-dimensional, transverse domain walls. The dynamic properties improve gradually as soon as these requirements are achieved even approximately.

In a particularly advantageous embodiment of the invention, the working structure is cylindrical at least in one section, and here is designed in particular as a straight cylinder and particularly advantageously as a circular cylinder. This is the embodiment based on which the inventors proved the existence of massless domain walls for the first time. The domain walls migrate along the cylinder axis. It was found that massless domain walls, when propagating, merely alter their positions and magnetization directions, but they do not alter their inner magnetic structures. Given the high symmetry, a cylindrical working structure has no shape anisotropy perpendicular to the migration direction of the domain walls, so that it can be produced from amorphous ferromagnetic material having no crystalline anisotropy, such as Permalloy. Moreover, such a highly symmetrical working structure can be well described analytically. The specific description section describes simulation-based and analytical examinations using cylindrical working structures.

In the embodiment of the invention in which the working structure can be designed as a cylinder at least in one section, this cylinder can, however, also have a polygonal cross-section, in particular having a even number of corners, and still more preferably having 6, 8 or 12 corners. A straight circular cylinder can thus be approximated, for example, and additionally further boundary conditions that exclude precisely this straight circular cylinder can be satisfied. The higher the number of corners, the lower is the shape anisotropy that must be compensated for by other solutions (such as material anisotropy).

At least in one section, the working structure advantageously has a diameter of 100 nm or less, and preferably of 50 nm or less. Advantageously, it has a diameter that is no more than 20 times, and preferably no more than 10 times, the exchange length of the ferromagnetic material. The exchange length in a ferromagnet is defined by the material parameters thereof and is typically approximately 5 nm. Magnetization typically remains homogeneous on length scales that do not much exceed the exchange length. If the diameter is significantly larger than the exchange length, the structure and dynamic properties of the domain walls change because the long-range ferromagnetic order breaks down.

The ferromagnetic material of the working structure is advantageously magnetically soft material. A soft magnetic material has a coercive field of less than 1000 A/m. In a particularly preferred embodiment of the invention, the soft magnetic material is Permalloy.

In a particularly advantageous embodiment of the invention, the magnetic field sensor is a GMR sensor. Such a sensor is a thin-film sensor and can thus advantageously be produced, together with the working structure, integrated on a substrate.

In a further advantageous embodiment of the invention, means for measuring the electrical resistance of the working structure, or of a section of the working structure, are provided. Because of the anisotropic magnetoresistance (AMR), this resistance depends on the number of domains contained in the working structure, or in the section. It is thus also dependent on the number of domain walls contained there.

The magnetoelectronic component can be a shift register for digital data. The digital data can then be encoded into the distance between two consecutive domain walls, in the same manner as the coding that is typical of hard drives. The velocity at which the domain walls pass through the working structure, which is not limited by the Walker limit, increases the speed with which such a shift register can be accessed, so that this can combine the speed of DRAM memory devices as well as the reversibility and non-volatility of hard drives with each other.

The magnetoelectronic component, however, can also be a logic gate, for example. Such a gate uniquely associates an output-side logical value with one or more input-side logical values. Just how quickly this is done when the logical values are coded in the form of domain walls depends on the velocity at which these domain walls pass through the gate.

In the specific description section, the inventors have demonstrated, through analytical computations, that massless domain walls exist in a working structure that has a cylindrical design in at least some sections. Over the course of this work it was found that the angular velocity at which the magnetization direction of massless domain walls rotates perpendicular to the migration direction through the working structure is dependent on the non-adiabatic spin transfer torque term, which is typically difficult to determine and is added to the Gilbert equation so as to detect spin current-induced effects. The invention thus also relates to a method for measuring the non-adiabatic spin transfer parameter $\beta$ of a ferromagnetic material.

This parameter describes the magnitude of a component of the torque that acts on the local magnetization of the working structure when conduction electrons pass through a ferromagnetic working structure. To this end, the spin of the conduction electrons interacts with the local magnetization. As a result of this interaction, a torque that is divided into two components acts on the local magnetization, with these components being positioned perpendicularly to each other and defined as the adiabatic spin transfer term and non-adiabatic spin transfer term. The mathematical form of these torque terms will be described later in the accordingly expanded Gilbert equation. The parameter $\beta$ is a non-dimensional coefficient describing the magnitude of the component of the torque that is related to the non-adiabatic term.

In physical respects, adiabatic and non-adiabatic spin transfer effects, and the components of the torque exerted on the magnetization that are related thereto, differ in two different manners in which the spin of the conduction electrons interacts with the local magnetization. In the adiabatic case, it is assumed that the spin of the conduction electrons instantaneously adapts to any location of the ferromagnetic sample of the local magnetization. Thus, when an electron current flows along an inhomogeneously magnetized structure, the electron spin continuously, and substantially instantaneously, adapts to the local magnetization direction. This rotation of the electron spin is associated with a change in angular momentum. Because the total angular momentum is preserved, an accordingly opposed angular momentum is transferred to the magnetization. This change in the angular momentum per unit of time corresponds to the adiabatic spin transfer torque that acts on the magnetization.

The non-adiabatic case takes into account the fact that the spins of high-energy conduction electrons cannot fully and instantaneously adapt to the local magnetization direction when flowing through inhomogeneously magnetized regions. This results in maladjustment of the electron spin with the local magnetization, which is likewise associated with a torque. The magnitude of this effect is presently largely unknown and is the subject of intense and controversial discussions in the technical literature. The magnitude of this effect is generally quantified by the non-adiabatic spin transfer parameter $\beta$. Until now, this value has been very difficult to determine experimentally. The subject matter of the method is therefore a drastically simplified and substantially model-independent determination of $\beta$ as compared to the prior art.

According to the invention, the angular velocity is measured at which the magnetization direction of, notably massless, domain walls rotates about the direction of migration when the domain walls pass through a working structure made of ferromagnetic material.

An electron spin that is introduced in the ferromagnetic working structure can be in precession about the magnetization direction of the structure. As a result of preserving the angular momentum, this magnetization direction subsequently also changes.

The dynamics of the normalized localized magnetization $\vec{m}$ is described by the expanded Gilbert equation $$\frac{d\vec{m}}{dt} = \gamma \vec{H}_{eff} \times \vec{m} + \frac{\alpha}{M_s}\left[\vec{m} \times \frac{d\vec{m}}{dt}\right] - (\vec{u} \cdot \vec{\nabla})\vec{m} + \frac{\beta}{M_s}\vec{m} \times \left[(\vec{u} \cdot \vec{\nabla})\vec{m}\right]$$

This equation takes the current-induced magnetization dynamics into consideration in the latter two terms. $M_s$ is the saturation magnetization, $\gamma$ is the $\vec{H}_{eff}$ gyromagnetic ratio, $\vec{H}_{eff}$ is the effective field, $\alpha$ is the Gilbert damping factor, and $\beta$ is the non-adiabatic spin transfer parameter. The vector $\vec{u}$ is defined as $$\vec{u} = -\frac{g\mu_B P}{2eM_s}\vec{j}.$$

Herein, the current density is, g is the Landé g-factor, $\mu_B$ is the Bohr magneton, e is the elementary charge, and P is the spin polarization rate of the current.

The non-adiabatic spin transfer parameter $\beta$ describes the magnitude of the non-adiabatic contribution of the spin transfer effects, by which the conduction electrons interact with the local magnetization when they pass through inhomogeneously magnetized regions (such as through a domain wall) and thus exert a torque on the magnetization.

The inventors found that the angular velocity at which the magnetization direction of massless domain walls rotates about the direction of migration when passing through the working structure is dependent on the difference ($\beta-\alpha$) between the non-adiabatic spin transfer parameter $\beta$ and the Gilbert damping factor $\alpha$. By now being able to measure the angular velocity, it is possible to determine $\beta$ because the value of $\alpha$ can be determined in a wide variety of ways. According to the prior art, only $\beta$ was difficult to measure.

In an advantageous embodiment of the invention, for example, the value of $\alpha$ (Gilbert damping factor) is determined based on the velocity at which the domain walls pass through the working structure under the influence of the external magnetic field.

In a further advantageous embodiment of the invention, the value of the spin polarization P is determined based on the velocity at which the domain walls pass through the working structure under the influence of an electric current. It was found that the relationship between this velocity v and the spin polarization P is given by $$v = \left(\frac{1+\alpha\beta}{1+\alpha^2}\right) \cdot \left(\frac{g\mu_B}{2eM_s}\right) \cdot j \cdot P.$$

The left side of the equation has the measurement variable v, which is to say the domain wall velocity, and the right side has the required polarization P. The first term on the right side contains only α and β. The value of this first term can be equated to 1 with very good approximation because both α and β are typically much smaller than 1:

$$\left(\frac{1+\alpha\beta}{1+\alpha^2}\right) \cong 1$$

As an alternative, the values of α and β can be determined individually using the method according to the invention and then be employed.

The second term on the right side of the equation for the domain wall velocity contains only physical constants (Bohr magneton $\mu_B$, elementary charge e, the Landé g-factor g) and the saturation magnetization $M_s$, which is typically known from tables in the literature or the like, as it is a material-specific variable.

Other factors that remain in the equation include the electric current density j, which is known based on the total current and the cross-section of the working structure, and the required spin polarization P. The value of P can thus be easily determined based on the measurement of the domain wall velocity v when using known values. The spin polarization P is a highly technologically relevant quantity in spintronics. Achievements in this field are frequently measured based on the degree of spin polarization P that can be produced, injected in a component and preserved by this component during processing.

The value of β (non-adiabatic spin transfer parameter) is advantageously determined based on the frequency at which the magnetization direction of domain walls undergoes dipole oscillations under the influence of a current flowing through the working structure. This frequency is directly coupled, by a factor of 2π, to the angular velocity at which the magnetization direction of massless domain walls rotates about the direction of migration when passing through the working structure. Experimentally, it is easier to measure the frequency of the dipole oscillations than to directly measure the angular velocity.

The angular velocity ω of the domain wall can be measured by way of the corresponding frequency of the dipole oscillations (f=ω/2π), which can be determined by means of a suitable magnetic field sensor, for example. In practical experience, however, it will be very difficult, in many cases, to directly distinguish between positive and negative values of ω. Differing algebraic signs of ω describe rotations of the domain walls in opposing directions. So as to eliminate the ambiguity of the value of β which results from the unknown algebraic sign of ω, a longitudinal magnetic field can additionally be applied, which can be used to move the domain walls along the working structure, in addition to the electric current. This additional magnetic field effects a change in the angular velocity by a value Δω that is proportional to the field strength. It is thus possible to distinguish between the cases of −ω and +ω, which originally were hard to separate from each other, because the more easily measured absolute value of the oscillation frequency f increases in one case |ω+Δω| and decreases in the other case |−ω+Δω| (without limiting the generality of the invention, it was assumed here that Δω is positive, which is to say that the magnetic field is present in the positive z direction, counter to the migration direction of the domain walls).

Notably the magnetoelectronic components according to the main claim and the additional independent claim can be employed to carry out the method. These also serve as measuring instruments.

The subject matter of the invention will be described in more detail hereafter based on figures, without thereby limiting the subject matter of the invention.

DESCRIPTION OF THE PREFERRED EMBODIMENTS

The particularly preferred embodiment of a cylindrical working structure was examined both by way of micromagnetic simulations and analytically. The simulation was carried out for the normalized local magnetization $\vec{m}$ using a finite element algorithm based on the aforementioned Gilbert equation.

In the exemplary embodiment that was examined, the working structure is a wire made of Permalloy (Py) having the material parameters $\mu_0 M_s$=1 T (saturation magnetization), vanishing anisotropy and exchange constant A=1.3*10$^{-11}$ J/m. Such a working structure can be used as a magnetic shift register, for example.

Figure 1:
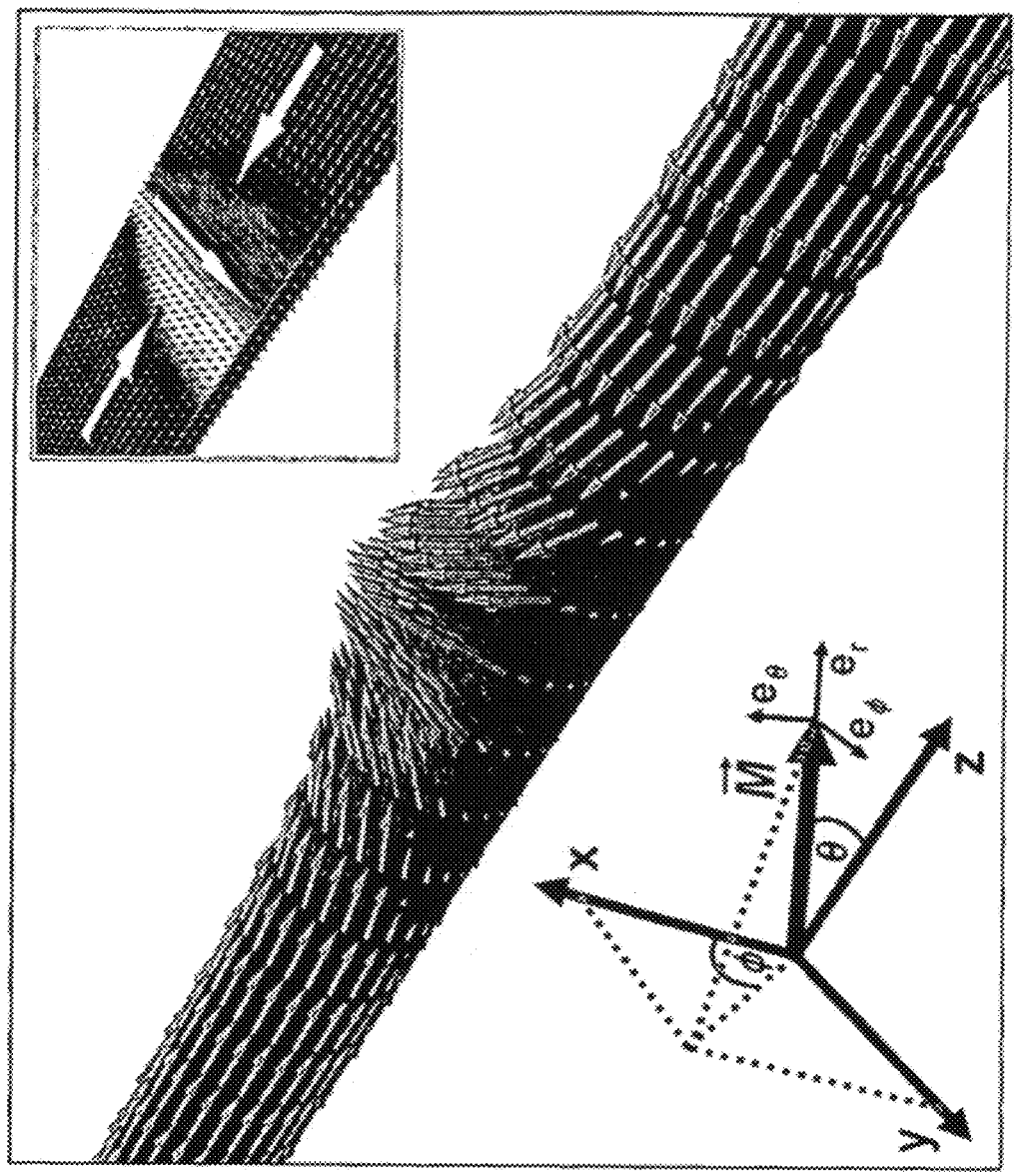
FIG. 1: is a configuration of a transverse domain wall in a cylindrical wire having a length of 4 μm and a diameter of 10 nm.

FIG. 1 shows the configuration of a transverse domain wall in a cylindrical wire having a length of 4 μm and a diameter of 10 nm, which was obtained as the result of the simulation. The Cartesian coordinate system that was used for the simulation and a spherical coordinate system that was employed for the analytical examination are shown on the bottom left of FIG. 1. For comparison, the configuration of a transverse domain wall in a Permalloy strip having a width of 100 nm and a thickness of 10 nm is shown as an inserted image at the top right of FIG. 1. For the simulation, the volume of the wire was discretized into 259,200 tetrahedrons having a cell size of approximately 1.25 nm×1.25 nm×5 nm. Given the axial symmetry, the structure of the wall and the energy thereof are invariant with respect to the rotations of the magnetization in the xy plane.

The domain wall moves in the direction of the electron flow (negative z direction) under the influence of an electric current along the positive z axis. In addition to the linear motion along the wire axis, the magnetization direction of the domain wall rotates about the wire axis.

Figure 2:
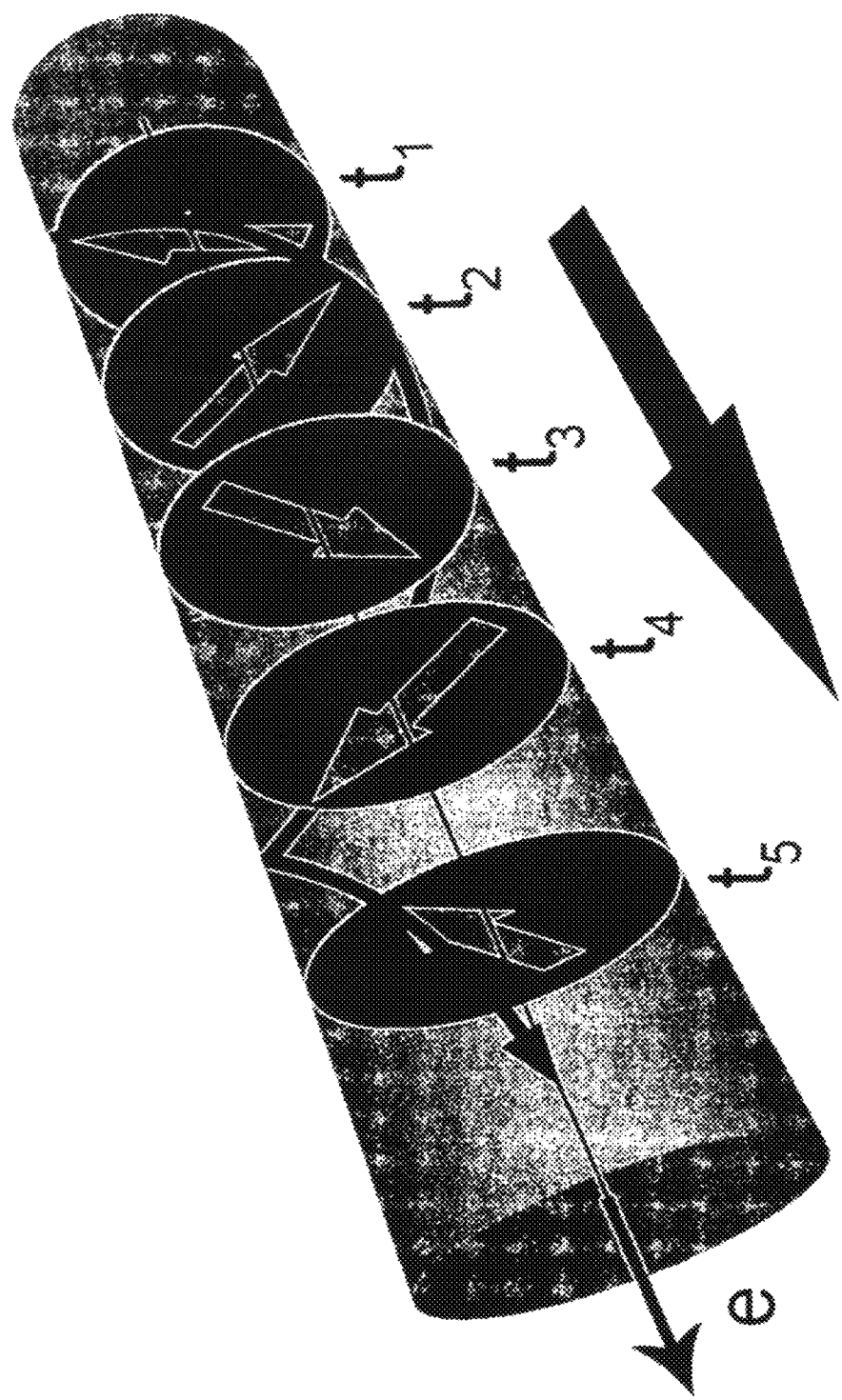
FIG. 2: is a sketch of the characteristic rotary motion of the magnetization direction of domain walls in a cylindrical wire.

FIG. 2 shows this characteristic rotary motion of the magnetization direction. The black cross-sections of the wire shown here in the form of a tube indicate the positions of the domain walls at various times $t_1$ to $t_5$. The arrows in these cross-sections indicate the orientations of the transverse magnetization direction of the domain wall at these times at these locations. The helix inscribed in the wire illustrates the precession motion of the domain wall. In the simulations, α was fixed at 0.02, while the value of β varied between 0 and 0.1.

Figure 3A:
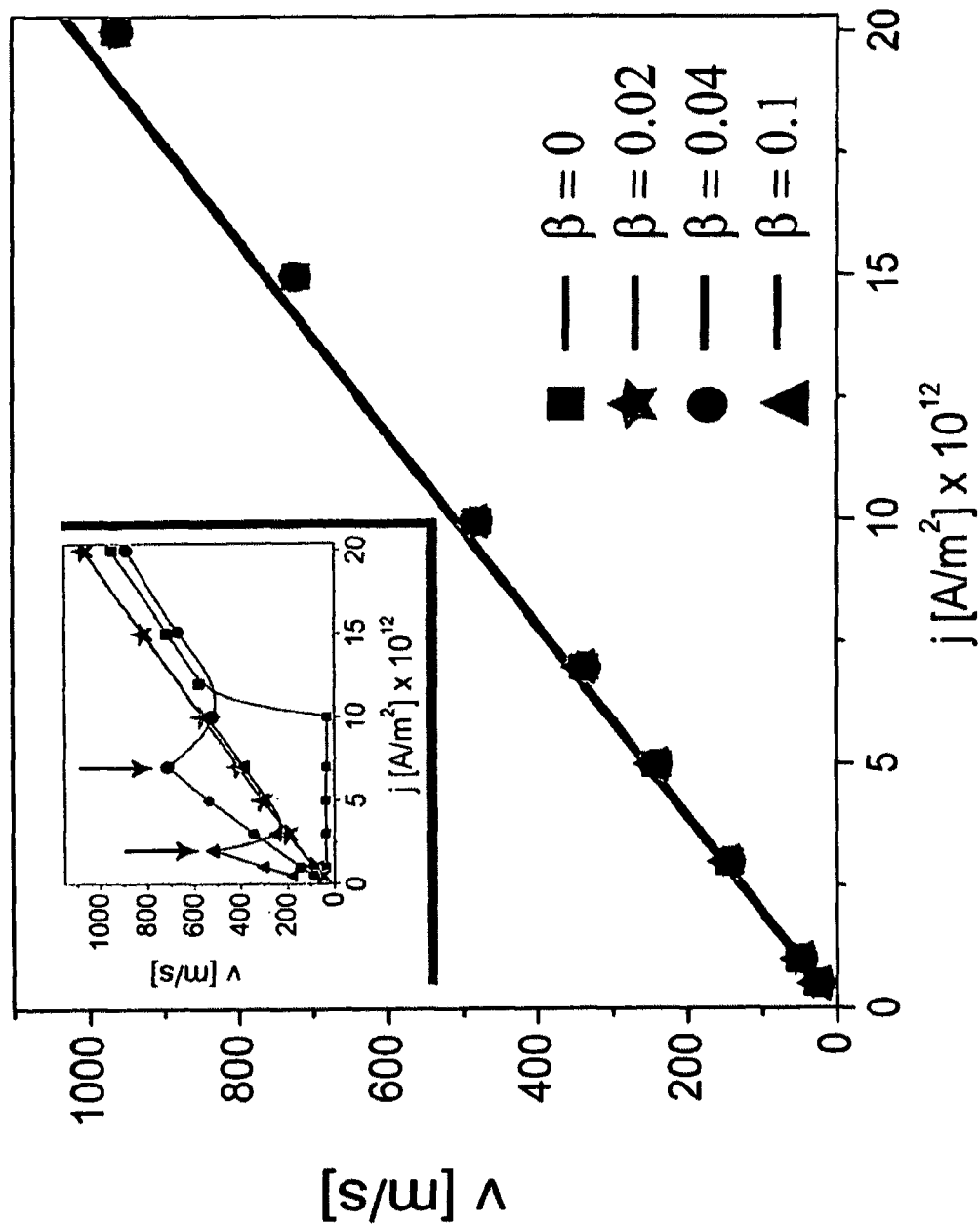
FIG. 3: shows the linear velocity of the domain wall as a function of the current density in a cylindrical wire (sub-image a); the displacement of the domain wall as a function of time for various current density values (sub-image b); a comparison of the velocities of the domain walls in cylindrical wires having two different diameters (sub-image c)

FIG. 3a shows the linear velocity v of the domain wall as a function of the current density j in a cylindrical wire having a diameter of 10 nm for α=0.02 and four different values of β. The lines in FIG. 3a represent analytically computed values of u. The velocity is linearly dependent on j and is independent of β. For comparison, the motion of the domain wall in a thin strip was simulated using the same parameters (inserted image in FIG. 3a). The lines in this inserted image are merely a graphical sketch of the functional curves based on the simulated individual values. The wire behaves fundamentally differently from the strip. No intrinsic pinning is found in the wire for β=0. In contrast, a minimal (critical) current must be injected in the strip in order to trigger the motion of the domain wall. For small values of j, the velocity of the domain wall was low and independent of j. This can be attributed to a magnetostatic effect, which is related to the finite sample size: If the domain wall is moved out of the center of the sample, a longitudinal magnetostatic field is obtained.

It should also be noted that the domain walls in the round wire are massless. The profiles thereof do not change during the motion. The simulation did not produce any mass whatsoever for the domain wall even if unrealistically high values were assumed for j or external magnetic fields, at which the domains break down due to nucleation processes. Whether the domain walls are massless strictly mathematically or only practically, however, is irrelevant for the technical application in the magnetoelectronic component, and specifically in the shift register.

The structure of the domain wall in the cylindrical wire does not break down because of the Walker limit. The Walker limit, however, is reached in the strip when β>α. As is indicated by the arrows in the inserted image in FIG. 3a, this results in a severe drop in velocity.

The velocity of the domain wall in the cylindrical wire is not dependent on β. The strip, in contrast, exhibits strong dependence on β. In the round wire, the domain wall achieves a constant velocity immediately after the current is activated. This observation agrees with the domain wall having no mass or inertia.

Figure 3B:
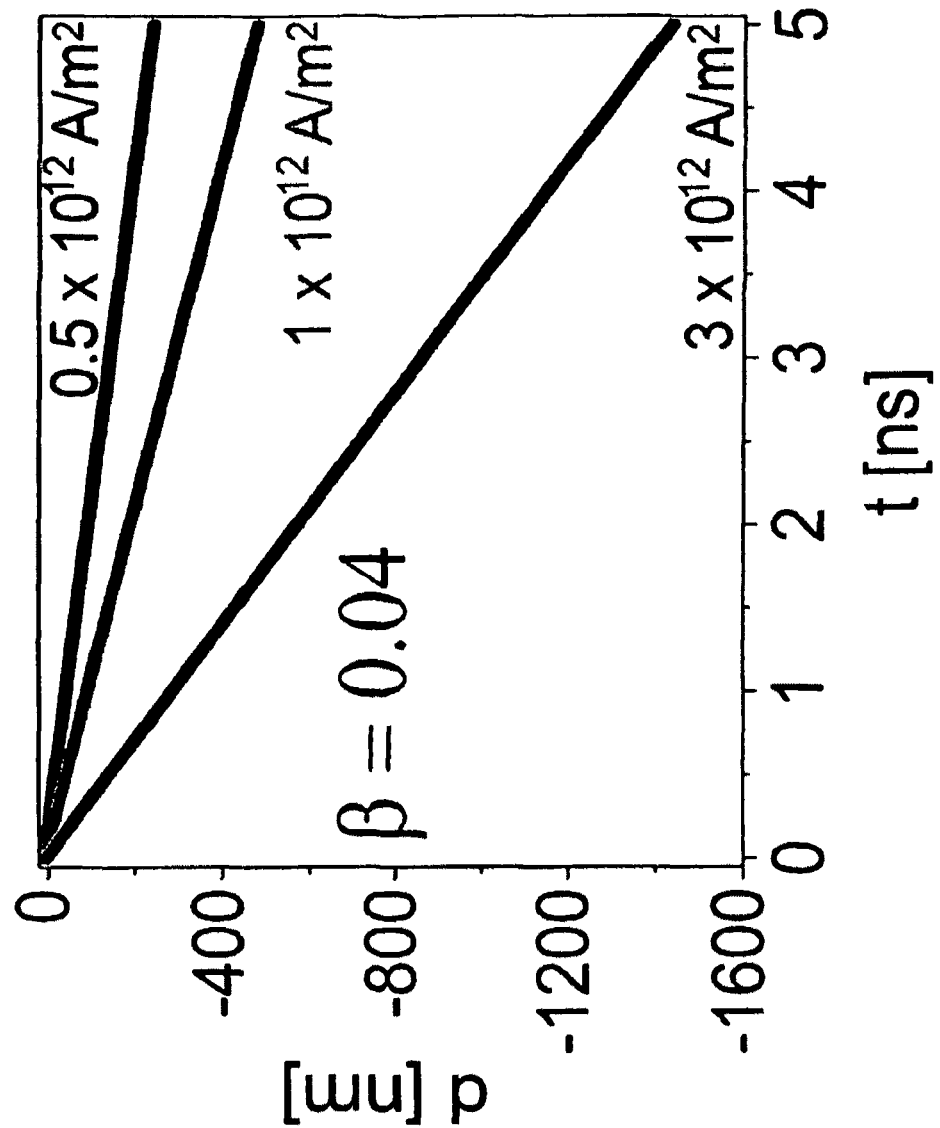

FIG. 3b illustrates this unimpaired motion of the domain wall. Here, the displacement d of the wall is plotted as a function of the time t for three different values of j.

Figure 3C:
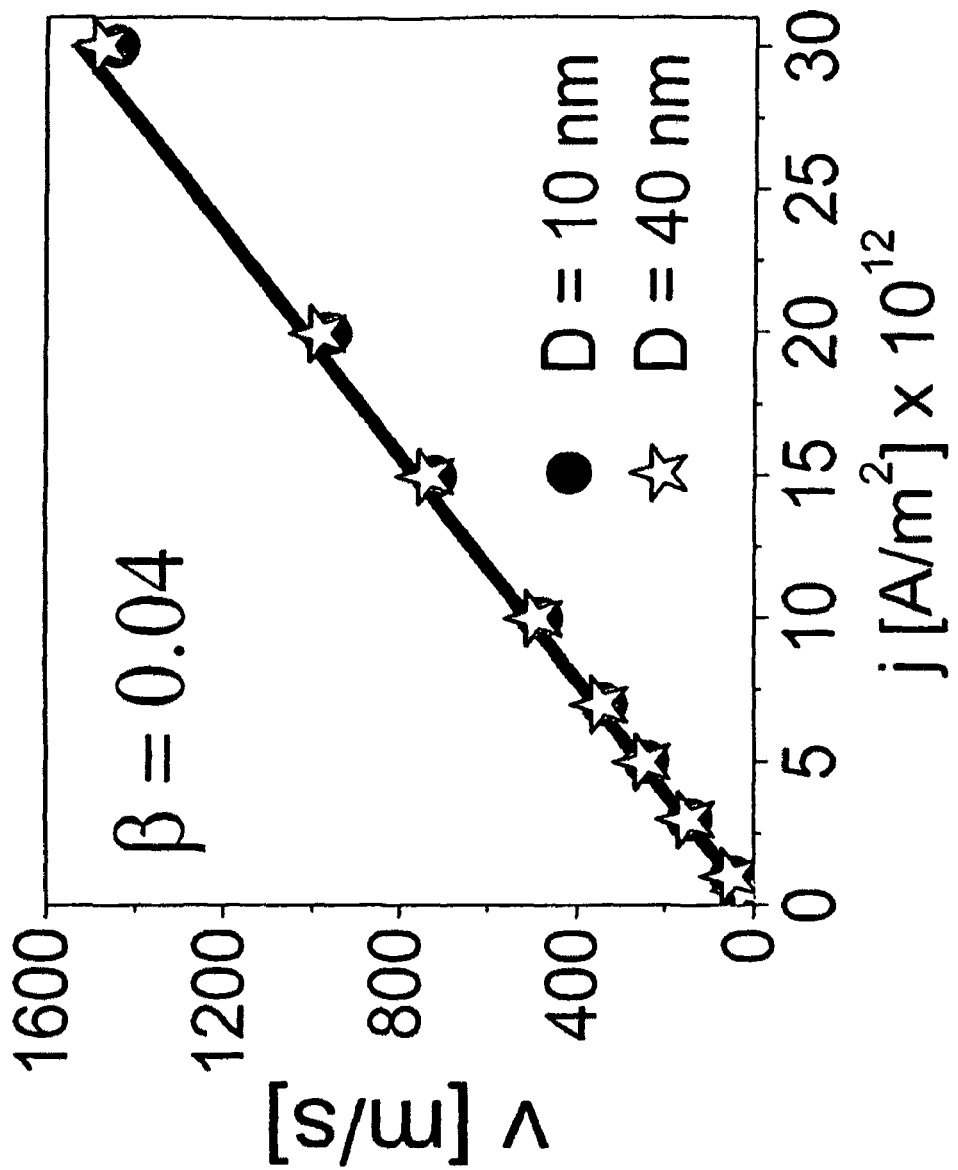

FIG. 3c shows a comparison of velocities of the domain walls in cylindrical wires having two different diameters (10 nm and 40 nm). This shows merely low dependency on the wire diameter.

Figure 4:
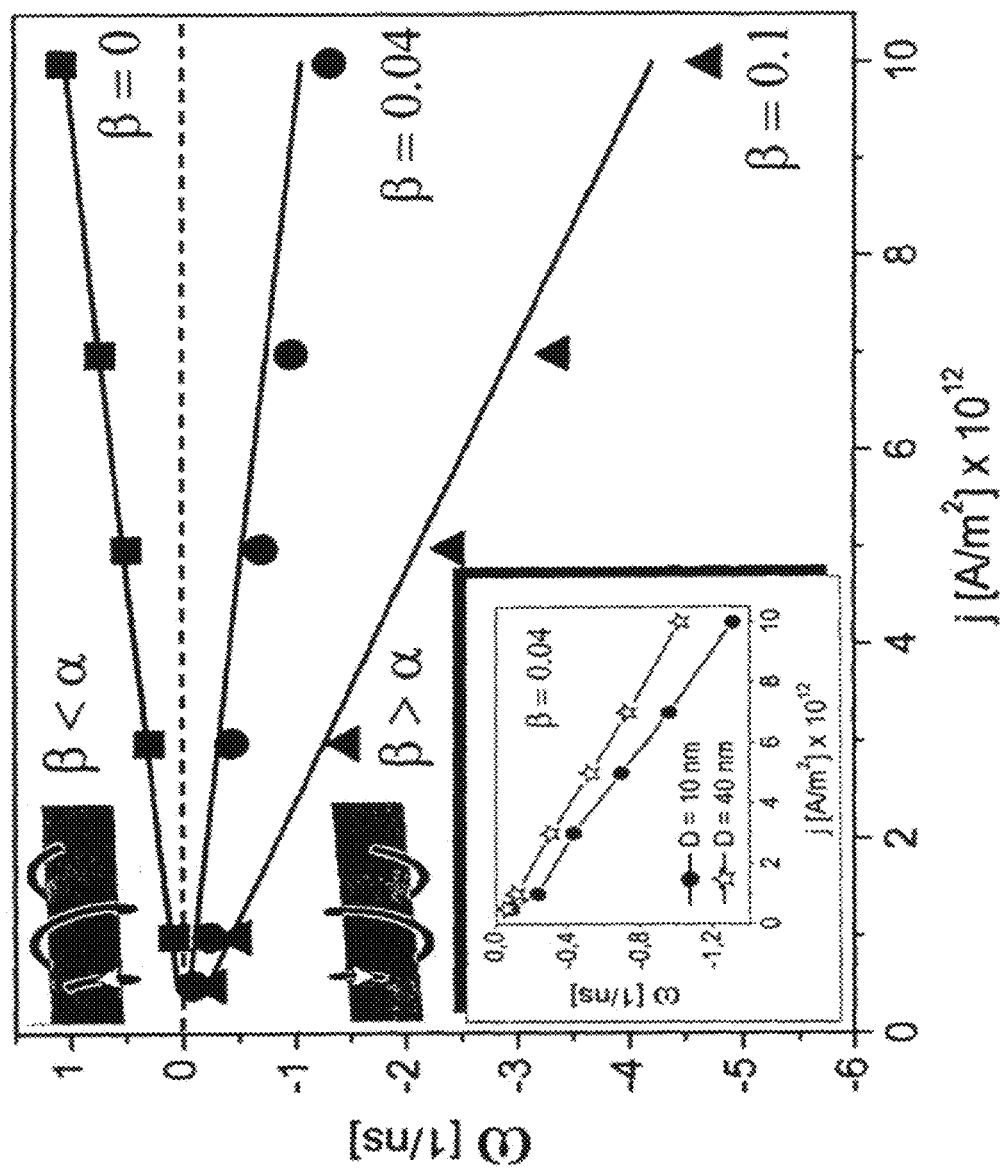
FIG. 4: shows the dynamics of the magnetization direction in the domain wall.

FIG. 4 summarizes the dynamics of the magnetization direction in the domain wall. The drawing shows the angular velocity at which this magnetization direction rotates, over the current density j, for three different values of β. An inserted image on the bottom left of FIG. 4 shows a comparison of the angular velocities between the wire that is 10 nm thick and the wire that is 40 nm thick. Analogous to the linear displacement of the domain wall, the angular velocity at which the magnetization direction rotates is linearly dependent on j. However, it also depends on β; it was found that it is proportional to (β−α). The direction of rotation changes with α=β, where the magnetization direction of the domain wall ideally does not rotate. In the simulation, slow rotation is also obtained in this case. This is due to a magnetostatic effect, which can be attributed to the finite length of the simulated wire.

In order to examine the physical background of this simulated data, the field at which the structure of Bloch domain walls breaks down as a result of the Walker limit was computed using an analytical model, which was developed in (A. Mougin, M. Cormier, J. P. Adam, P. J. Metaxas, J. Ferré, "Domain wall mobility, stability and Walker breakdown in magnetic nanowires", Europhysics Letters 78, 57007 (2007)). The spherical coordinate system shown on the bottom left of FIG. 1 was employed. The angular velocities of magnetization depend as follows on the torques lab acting on the wall:

$$\dot{\theta} = \frac{d\theta}{dt} = -\frac{\gamma}{M_s}\Gamma_\theta$$

$$\dot{\phi} = \frac{d\phi}{dt} = -\frac{\gamma}{M_s}\Gamma_\phi$$

The expression for the total torque acting in the domain wall is provided in Equation 10 of Mougin et al. There, a static magnetic field H, which acts along the z direction, a demagnetization field, an equivalent damping field, which describes the torque caused by damping, and an electric current flowing in the z direction are taken into consideration. Utilizing the cylinder geometry of the wire and the simplification that only the center of the domain wall (Θ=π/2) is taken into account, all terms that belong to the demagnetization field can be eliminated, resulting in the following:

$$\Gamma_\theta = \frac{\alpha M_s}{\gamma}\dot{\phi} + \frac{M_s u}{\gamma}\frac{\partial \theta}{\partial z}\bigg|_{wc}$$

$$\Gamma_\phi = -M_s H - \frac{\alpha M_s}{\gamma}\dot{\theta} - \frac{\beta M_s u}{\gamma}\frac{\partial \theta}{\partial z}\bigg|_{wc},$$

where the index wc denotes the center of the domain wall.

For the sake of simplicity, initially the motion of a domain wall which is driven by a static external magnetic field acting along the z axis was examined. With u=0, this results in:

$$\dot{\theta} = -\alpha\dot{\phi}$$

$$\dot{\phi} = \frac{\gamma H}{1+\alpha^2}.$$

In the static external field, the domain wall (apart from a prefactor $1/(1+\alpha^2)$ that is close to one) is in precession at the Larmor frequency and moves in the field direction as a result of the damping. As far as the achievable velocity is concerned, the motion of domain walls which is driven by an external field is of lesser interest given the weak prefactor α.

H=0, instead of u=0, was assumed for the motion of domain walls which is driven by an electric current, resulting in the following:

$$\dot{\theta} = -\frac{(1+\alpha\beta)u}{1+\alpha^2}\frac{\partial \theta}{\partial z}\bigg|_{wc}$$

-continued $$\dot{\phi} = -\frac{(\beta-\alpha)u}{1+\alpha^2}\frac{\partial\theta}{\partial z}\bigg|_{wc}.$$

These equations show how the adiabatic term influences the linear motion of the domain wall, while the difference between the non-adiabatic term and the damping term influences the rotation of the magnetization direction. In contrast, with Bloch domain walls or transverse domain walls in strips, the damping term and/or the non-adiabatic term create a distortion of the domain wall, which is to say a non-vanishing mass. This non-vanishing mass causes various undesirable effects, such as intrinsic pinning and the Walker limit for the velocity. The critical current, or the critical field, at which the domain wall structure breaks down as a result of the Walker limit is typically defined as the point at which the center of the domain wall begins to rotate out of the original plane thereof (Ø≠0). When the working structure is a wire, however, the symmetry thereof allows the magnetization of the domain wall to rotate freely, without the domain wall becoming deformed. The angular velocity here depends on (β−α), while the linear velocity at which the domain wall moves is independent of β.

It is remarkable that both $\dot{\theta}$ and $\dot{\phi}$ are proportional to $\partial\Theta/\partial z|_{wc}$, which is a measure of the width of the domain wall. The width of the domain wall is not relevant for the linear velocity v because v=$\dot{\theta}$·∂z/∂θ. The linear velocity is thus substantially equal to u, which is plotted in FIG. 3a in the form of lines. This explains why the linear velocity, as shown in FIG. 3c, is independent of the thickness of the wire, although the thicker wire forms wider domain walls. This is consistent with the simulation in the inserted image on the bottom left of FIG. 4, which shows that the angular velocity is less in the thicker wire. The lines in FIG. 4 show analytical values of the angular velocity for various values of β. These lines were obtained using a value for $\partial\Theta/\partial z|_{wc}$ that was extracted from a simulated domain wall profile. The simulation also confirms, almost perfectly, the result that was obtained analytically, which is that the same angular velocities should develop for identical (β−α) that are identical in terms of the absolute values and have differing algebraic signs.

The dependence of the angular velocity on the difference between α and β opens up interesting possibilities for measuring the non-adiabatic spin transfer parameter β, which is the prefactor for the non-adiabatic spin transfer torque term and which is typically difficult to determine. The characteristics of the field- and current-driven motions of domain walls in round wires should allow precise determination of this information, because the value of α follows from the field-driven velocity. The value of β can then be determined based on the frequency of the current-driven dipole oscillations, which follow from the expressions for $\dot{\theta}$ and $\dot{\phi}$ in the current-driven case. The polarization rate P, which in this case is almost identical to u, can also be determined from the current-driven velocity of the domain wall (see FIG. 3 and the corresponding explanations in the general description section).

The determination of the non-adiabatic spin transfer parameter β according to the method proposed here can begin with knowledge of, or when having experimentally determined, the value of the damping parameter α. The value of α is advantageously measured based on the measurement of the velocity at which the domain walls move along the working structure under the influence of a longitudinally applied magnetic field. According to the aforementioned dynamics, this velocity is given by $$v = -\frac{\alpha}{1+\alpha^2}\cdot\gamma\cdot\frac{1}{\partial\theta/\partial z|_{wc}}\cdot H$$

In addition to the damping constant α, the velocity is thus dependent on the gyromagnetic ratio γ and the magnetic field strength H of the driving field as well as on the magnetic structure of the domain wall. The $\partial\Theta/\partial z|_{wc}$ value describes the gradient of magnetization along the working structure in the center of the domain wall. It is related to the domain wall width and can be determined by analytical models, experimental measurements, or computer simulations. The value of α can thus be determined according to the above equation, because this is the only unknown variable in this equation. Mathematical ambiguities that occur in solving the quadratic equation for a can be eliminated by the condition α<<1.

After the value of α is determined, β can be determined based on the frequency of the dipole oscillations that the domain walls perform while they are moved through the working structure under the influence of an electric current. The angular velocity ω is given by $$\omega = \dot{\varphi} = \frac{\beta-\alpha}{1+\alpha^2}u\frac{\partial\theta}{\partial z}\bigg|_{wc}$$

where the value of $\partial\Theta/\partial z|_{wc}$ can again be determined by measurement or estimated by computations. The value of u is given by $$u = -\frac{g\mu_B P}{2eM_s}j.$$

Possibilities for determining the variables that occur in u were described above. This creates a direct, simple relationship between the measurable angular velocity ω and the required value of the non-adiabatic spin transfer parameter β.

The invention claimed is:

1. A method for measuring the nonadiabatic spin transfer parameter β of a ferromagnetic material, comprising:
measuring angular velocity wherein magnetization direction of domain walls rotates about a direction of migration when the domain walls pass through a working structure made of the ferromagnetic material and wherein a non-adiabatic component of said angular velocity results from a local maladjustment between spin and magnetization in the ferromagnetic material.

2. The method according to claim 1, wherein the value of the Gilbert damping factor is determined based on the velocity at which the domain walls pass through the working structure under the influence of an external magnetic field.

3. A method according to claim 1, wherein the value of the spin polarization P is determined based on the velocity at which the domain walls pass through the working structure under the influence of an electric current.

4. A method according to claim 1, wherein the non-adiabatic spin transfer parameter b is determined based on the frequency at which the magnetization direction of domain walls undergoes dipole oscillations under the influence of a current flowing, through the working structure.

5. A magnetoelectronic component, comprising:
a longitudinally-extending working structure made of a ferromagnetic material that generates a magnetic field, and
at least one magnetic field sensor for sensing the magnetic field generated by the working structure,
wherein the working structure, when an electric current is received at the working structure, is configured to comprise:
magnetic first domain walls that migrate along the working structure, and
massless domain walls having a transverse magnetization direction of which in a center has no preferred direction in a plane perpendicular to a migration direction along the working structure, and
wherein the massless domain walls have a predominant direction of magnetization in a center of the working structure so as to comprise frontal domain walls having a magnetization, along a migrating direction through the working structure, that is rotated by 180 degrees.

6. A magnetoelectronic component according to claim 5, wherein the working structure has no shape anisotropy perpendicular to the migration direction of the massless domain walls.

7. A magnetoelectronic component according to claim 5, wherein the working structure has material anisotropy.

8. A magnetoelectronic component, comprising:
a longitudinally-extending working structure made of a ferromagnetic material that generates a magnetic field, and
at least one magnetic field sensor for sensing the magnetic field generated by the working structure,
wherein the working structure, when an electric current is received at the working structure, is configured to comprise:
magnetic first domain walls that migrate along the working structure, and
massless domain walls having a transverse magnetization direction of which in a center has no preferred direction in a plane perpendicular to a migration direction along the working structure, and
wherein the massless domain walls have a predominant direction of magnetization in a center of the working structure so as to comprise transverse domain walls having a magnetization, along a migrating direction through the working structure, that is rotated by 90 degrees.

* * * * *